United States Patent
Bechade

[19]

[11] Patent Number: 5,805,491
[45] Date of Patent: Sep. 8, 1998

[54] FAST 4-2 CARRY SAVE ADDER USING MULTIPLEXER LOGIC

[75] Inventor: Roland A. Bechade, Somerville, N.J.

[73] Assignee: International Business Machines Corporation, Armonk, N.Y.

[21] Appl. No.: 893,802

[22] Filed: Jul. 11, 1997

[51] Int. Cl.[6] ................................................. G06F 7/50
[52] U.S. Cl. .................. 364/786.03; 364/760.02
[58] Field of Search ............................ 364/786.03, 760.02

[56] References Cited

U.S. PATENT DOCUMENTS

| | | | |
|---|---|---|---|
| 4,228,520 | 10/1980 | Letteney et al. | 364/786.03 |
| 4,901,270 | 2/1990 | Galbi et al. | 364/786 |
| 5,206,828 | 4/1993 | Shah et al. | 364/784 |
| 5,321,644 | 6/1994 | Schibinger | 364/737 |
| 5,343,418 | 8/1994 | Zinger | 364/784 |
| 5,436,574 | 7/1995 | Veenstra | 326/39 |
| 5,491,653 | 2/1996 | Taborn et al. | 364/786.03 |
| 5,625,582 | 4/1997 | Timko | 364/786.03 |

OTHER PUBLICATIONS

"4–2 Carry–Save Adder Implementation Using Send Circuits", IBM Technical Disclosure Bulletin, vol. 20 No. 9 Feb. 1978 pp. 3594–3597.
"4–2 Carry–Save Adder Module", IBM Technical Disclosure Bulletin, vol. 23, No. 8 Jan. 1981, pp. 3811–3814.
"Fast Carry Save Adder", IBM Technical Disclosure Bulletin, vol. 33, No. 6B Nov. 1990, pp. 157–159.

*Primary Examiner*—David H. Malzahn
*Attorney, Agent, or Firm*—Whitham, Curtis & Whitham; Eugene Shkurko, Esq.

[57] ABSTRACT

A fast 4-2 carry save adder using multiplexers and inverters only, for receiving four one bit data inputs and a one bit carry-in, and generating a sum and a carry-dependent output in three logic delays and a carry-independent carry out in two logic delays. The 4-2 carry adder has particular application in multiplier arrays.

7 Claims, 2 Drawing Sheets

FAST 4-2 CARRY SAVE ADDER USING MULTIPLEXER LOGIC

DESCRIPTION

1. Field of the Invention

This invention generally relates to the field of digital arithmetic circuitry and, more particularly, to fast 4-2 binary carry-save adders.

2. Description of the Related Art

A 4-2 carry-save adder, for the purposes of this description, is an adder that receives four one-bit binary data inputs and a one-bit carry input, all of the same weight and, in response to these five inputs, generates a one-bit binary data output of the same weight as the data and carry inputs, and generates two one-bit output carries, each of a weight which is one increment larger than that of the input bits. The two one-bit carries may be added-or otherwise processed by subsequent processing blocks.

The meaning of "4-2", as used for this description, can be more than the meanings of "4-2" used in the related art, as the related art may use "4-2" to identify an adder which receives four one-bit data operands, or three-one bit data operands and a one-bit carry-in, and outputs a one-bit sum and only a single carry bit.

A 4-2 carry-save adder is used, for example, in N-bit by M-bit multiplier arrays, in order to reduce the number of inputs to be added in a column of the array by a factor of two.

However, there is a propagation problem with the 4-2 carry-save adders of the prior art, which is exacerbated when a substantial number of such adders are interconnected, for example, to multiply two 32-bit numbers.

There are prior art attempts at shorter propagation carry-save adders, but each employs four or more stages of logic between the input and the sum and carry outputs, in addition to having architectures that could be impractical or not preferred for some applications.

One example is shown in U.S. Pat. No. 5,206,828 to Shah et al, with FIG. 4 having a carry-save adder receiving a sum at its input line 24, a carry at line 26, but then connects these to more than three inverter stages in series, in addition to at least two (or more) stages of AND/OR type logic.

Another example, although not a "4-2 carry-save adder" as used in this description, is shown by U.S. Pat. No. 4,901,270 to Galbi et al. Galbi FIGS. 5 and 6 show what it terms as a "four-to-two" adder, which takes four operands at a 4-bit parity generator 31, a carry from a block 32, and employs an inverter 36 and a pair multiplexers 35 and 33 to generate a $SUM_i$ and a single $CARRY_{i+1}$. As shown, the parity generator 31 consists of two exclusive-or stages (41,42) and 43, followed by an inverter 44. Galbi therefore contains approximately five logic delays from the inputs $W_i$–$Y_i$ to the $SUM_i$ and $CARRY_{i+1}$. Further, as stated above, the Galbi adder generates a sum and only one carry bit.

SUMMARY OF THE INVENTION

An object of the present invention is to provide a 4-2 carry-save adder having a reduced number of propagation delays compared to the prior art. The reduced number of propagation delays allows a large number of the 4-2 carry-save adders to be interconnected to implement, for example, a large M-bit adder, without incurring system-limiting delays.

Another object of the present invention is to provide a 4-2 carry-save adder which, in addition to having a lower propagation delay, comprises a modular architecture of simple, readily implementable elements. This permits economical fabrication and interconnection of a large number of these 4-2 carry-save adders, required for a large M-bit adder, within area constraints of, for example, integrated circuits (ICs), and to otherwise meet system needs.

Pursuant to these and other objectives, one embodiment of the present invention comprises three stages, each having a single logic delay. The first stage comprises a bank of inverters which receive four single-bit data inputs and one carry-in signals and generate an inverse of each. The second stage comprises a bank of multiplexers which select from and are controlled by the four input data signals and their inverses, to generate partial sums of the four data signals. The third stage comprises another bank of multiplexers which, controlled by the four input data signals and the carry input, and their respective inverses from the first stage, and by the partial sums from the second stage multiplexers, select from certain of those signals to output a sum bit, a carry-dependent carry bit and a carry-independent carry bit. With this invention, the total path from the data and carry input to the sum and carry-dependent carry out, which is the longest, is only three logic levels and, hence, three logic delays. The path for the carry-independent carry-out bit is even shorter at two logic delays.

BRIEF DESCRIPTION OF THE DRAWINGS

The foregoing and other objects, aspects, and advantages will be better understood from the following description of preferred embodiments of the invention with reference to the drawings, in which.

DETAILED DESCRIPTION OF THE EMBODIMENTS

Figure 1:
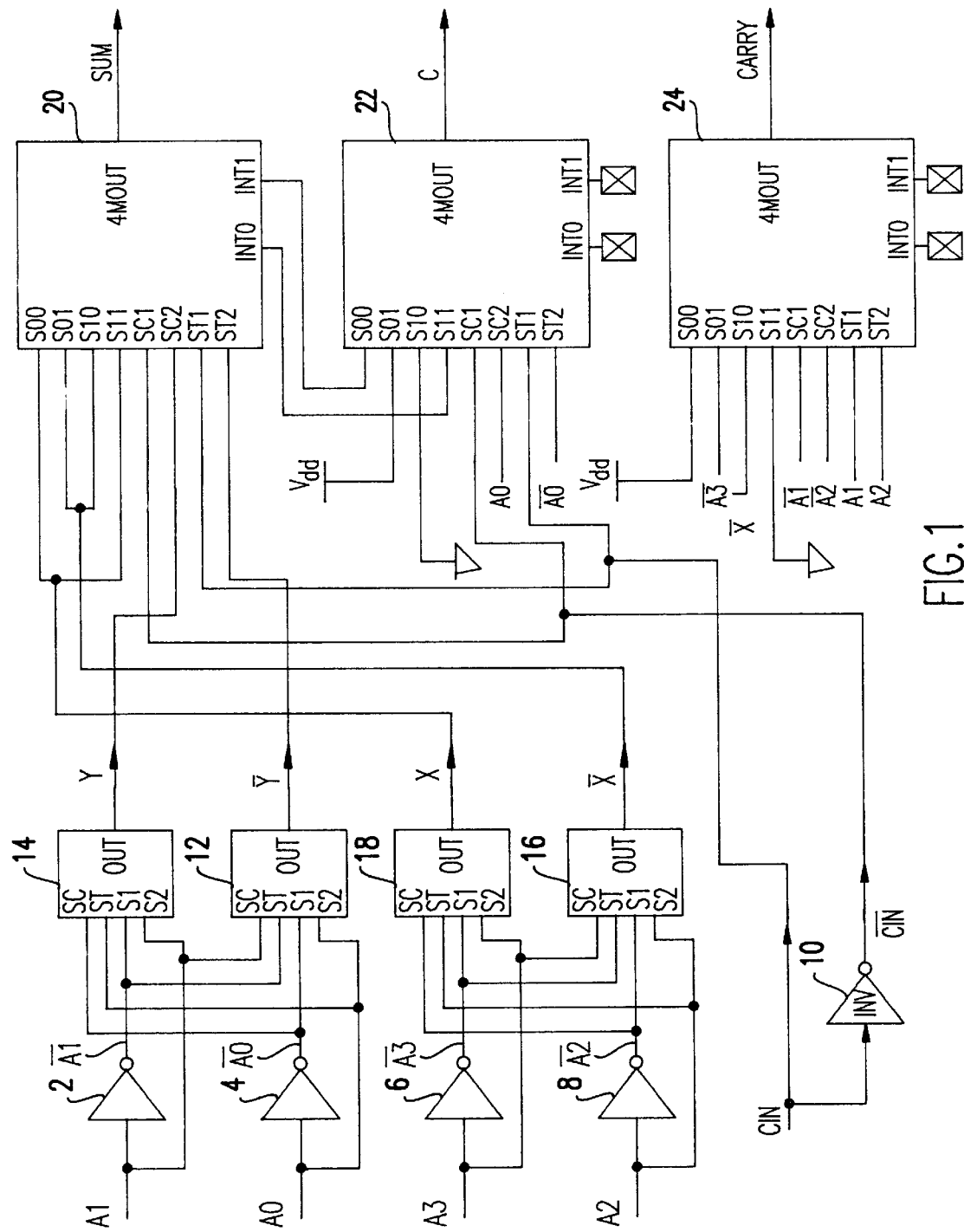
FIG. 1 is a block-level circuit diagram of an embodiment of the present invention depicting inputs, outputs, interconnects, and functional blocks.

Referring to the drawings, and more particularly to FIG. 1, there is shown an example embodiment of a 4-2 carry-save adder according to the present invention. Before describing the example embodiment and contemplated variations thereof, it will be understood that this invention relates to conventional integrated circuit (IC) technologies including, but not limited to, n-channel and p-channel metal oxide semiconductor (MOSFET) type and to complementary metal oxide semiconductor (CMOS), and that the circuitry described herein will function properly if fabricated according to known MOSFET, CMOS and other known design methods.

In FIG. 1, inverters 2, 4, 6, 8 and 10 receive binary inputs designated, for purposes of this description, as A0, A1, A2, A3 and CIN, respectively, and output the corresponding inverted signals $\overline{A0}, \overline{A1}, \overline{A2}, \overline{A3}$ and $\overline{CIN}$ respectively. A0, A1, A2, A3 and CIN will be described as having weight one, which means that each represents a base number, such as decimal two, raised to the same, or "one", power. The term "weight two" used later in this description, means the same base number, such as two, raised one incremental power higher than "weight one".

The A0, A1, A2, A3, $\overline{A0}, \overline{A1}, \overline{A2}$, and $\overline{A3}$ signals are input to, and control, a bank of four 2:1 multiplexers, labeled 12, 14, 16, and 18. Each 2:1 multiplexer has two data input terminals, S1 and S2, and has two control, or data select terminals, labeled as ST and SC respectively. The truth table for each of the 2:1 multiplexers is:

TABLE 1

| ST | SC | OUT |
|----|----|-----|
| 0  | 1  | S2  |
| 1  | 0  | S1  |

Figure 2:
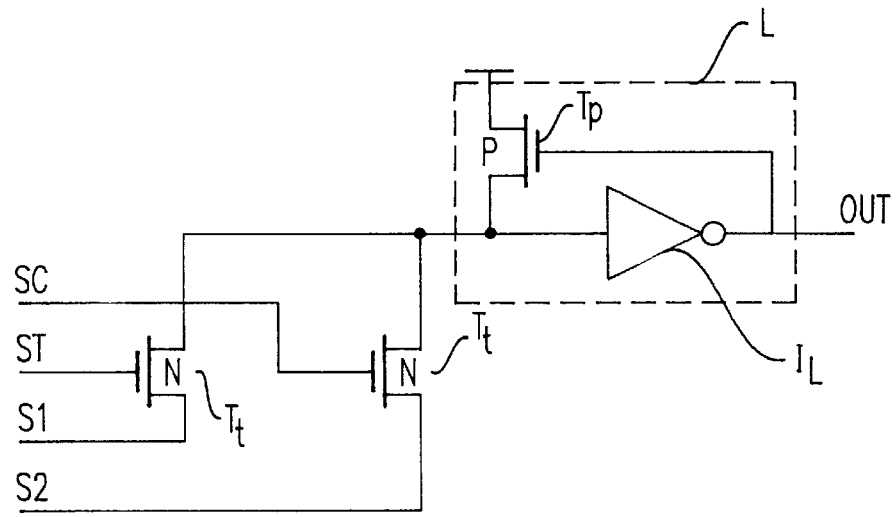
FIG. 2 shows an example transistor level schematic of a 2:1 multiplexer block of the FIG. 1 circuit diagram.

An example implementation of the 2:1 multiplexers 12, 14, 16 and 18 is shown in FIG. 2. The FIG. 2 circuit includes a pass-gate transistor Tt for its input S1, controlled by the input ST, and a pass-gate transistor Tc for the input S2, controlled by the SC input. For timing purposes, a soft latch L generates and holds the output OUT. The depicted soft latch L reduces system power, as the latch dissipates power only when it is in the process of flipping logic states. The FIG. 2 example latch L includes a p-channel field-effect transistor (PFET) Tp and an inverter IL, the output of the inverter being fed back via the PFET to perform the latching function.

The FIG. 2 circuit is but one example of a 2:1 multiplexer for this depicted embodiment, and other multiplexer architectures can be substituted. However, since the objective of this invention is to reduce propagation delay, alternative multiplexer architectures must be chosen accordingly. Further, the FIG. 2 circuit is depicted as using n-channel gates for Tc and Tt. As would be understood by one of ordinary skill, other gate technologies, such as p-channel gates can be substituted.

Referring again to FIG. 1, the data inputs A0–A3 and their inverses, $\overline{A0}$–$\overline{A3}$, output from inverters 2, 4, 6, and 8, connect to the 2:1 multiplexers 12, 14, 16, and 18 in a manner which, as will be understood from the description, generates partial sums of A0 and A1 and of A2 and A3. More particularly, data input A0 connects to the S2 data input of multiplexer 12, and its inverse, $\overline{A0}$, connects to the multiplexer's S1 data input. A0 also connects to the ST data select, or control, input of the 2:1 multiplexer 14. $\overline{A0}$ from inverter 4 connects to the other data select line SC of 2:1 multiplexer 14. Data input A1 connects to the S2 data input of the multiplexer 14. The inverse, $\overline{A1}$, from inverter 2 connects to the multiplexer 14 S1 data input. A1 also connects to the SC control input of the 2:1 multiplexer 12, and $\overline{A1}$ connects to that multiplexer's control input ST.

Data input A2 connects to the S2 data input of the multiplexer 16, and its inverse, $\overline{A2}$, connects to the S1 data input of the same multiplexer. A2 also connects to the ST control of the 2:1 multiplexer 18, and $\overline{A2}$ connects to the SC control input of the same 2:1 multiplexer 18. Data input A3 connects to the S2 data input of the 2:1 multiplexer 18, and its inverse, $\overline{A3}$, connects to the S1 data input of the same multiplexer. A3 also connects to the SC control input of the 2:1 multiplexer 16, and $\overline{A3}$ connects to that multiplexer's ST control input.

The signals output from the OUT terminals of the 2:1 multiplexers 12 and 14 are labeled Y and $\overline{Y}$, respectively. The logical value of outputs Y and $\overline{Y}$ corresponds to a partial sum data inputs A0 and A1, and defined by:

TABLE 2A

| A1 | A0 | Y | $\overline{Y}$ |
|----|----|---|----|
| 0  | 0  | 0 | 1  |
| 0  | 1  | 1 | 0  |
| 1  | 0  | 1 | 0  |
| 1  | 1  | 0 | 1  |

Table 2B below is the selection table performed by multiplexers 12 and 14, thereby obtaining the Table 2A values for Y and $\overline{Y}$.

TABLE 2B

| A1 | A0 | Y | $\overline{Y}$ |
|----|----|---|----|
| 0  | 0  | $\overline{A1}$ | $\overline{A0}$ |
| 0  | 1  | $\overline{A1}$ | $\overline{A0}$ |
| 1  | 0  | $\overline{A1}$ | A0 |
| 1  | 1  | $\overline{A1}$ | A0 |

The signal outputs from the OUT terminals of the 2:1 multiplexers 16 and 18 are labeled X and $\overline{X}$, respectively. The logical value of outputs X and $\overline{X}$ corresponds to a partial sum, representing A2 and A3, defined by:

TABLE 3A

| A3 | A2 | X | $\overline{X}$ |
|----|----|---|----|
| 0  | 0  | 0 | 1  |
| 0  | 1  | 1 | 0  |
| 1  | 0  | 1 | 0  |
| 1  | 1  | 0 | 1  |

Table 3B is the selection truth table performed by multiplexers 16 and 18, thereby obtaining the Table 3A values for X and $\overline{X}$.

TABLE 3B

| A2 | A3 | X | $\overline{X}$ |
|----|----|---|----|
| 0  | 0  | $\overline{A3}$ | $\overline{A2}$ |
| 0  | 1  | $\overline{A3}$ | $\overline{A2}$ |
| 1  | 0  | $\overline{A3}$ | A2 |
| 1  | 1  | $\overline{A3}$ | A2 |

As can be understood by one of ordinary skill in the art, using the 2:1 multiplexer 18 to generate $\overline{X}$, and using multiplexer 14 to generate $\overline{Y}$, provides these inverses in a manner parallel to, and co-incident with the generation of X and Y, instead of adding an inverter (and its delay) to the X and Y signals.

The signals X, $\overline{X}$, Y and $\overline{Y}$ output from 2:1 multiplexers 18, 16, 14, and 12, respectively, and the carry-in CIN and its inverse $\overline{CIN}$ are input to a bank of three 4:1 multiplexers, shown as 20, 22 and 24.

Truth Table 4 below generally defines each of the 4:1 multiplexers 20, 22 and 24, where SC1, SC2, ST1, ST2 and 4MOUT label the select and output terminals for the multiplexer itself.

TABLE 4

| SC1 | ST1 | SC2 | ST2 | 4MOUT |
|-----|-----|-----|-----|-------|
| 0   | 1   | 0   | 1   | S00   |
| 0   | 1   | 1   | 0   | S01   |
| 1   | 0   | 0   | 1   | S10   |
| 1   | 0   | 1   | 0   | S11   |

Figure 3:
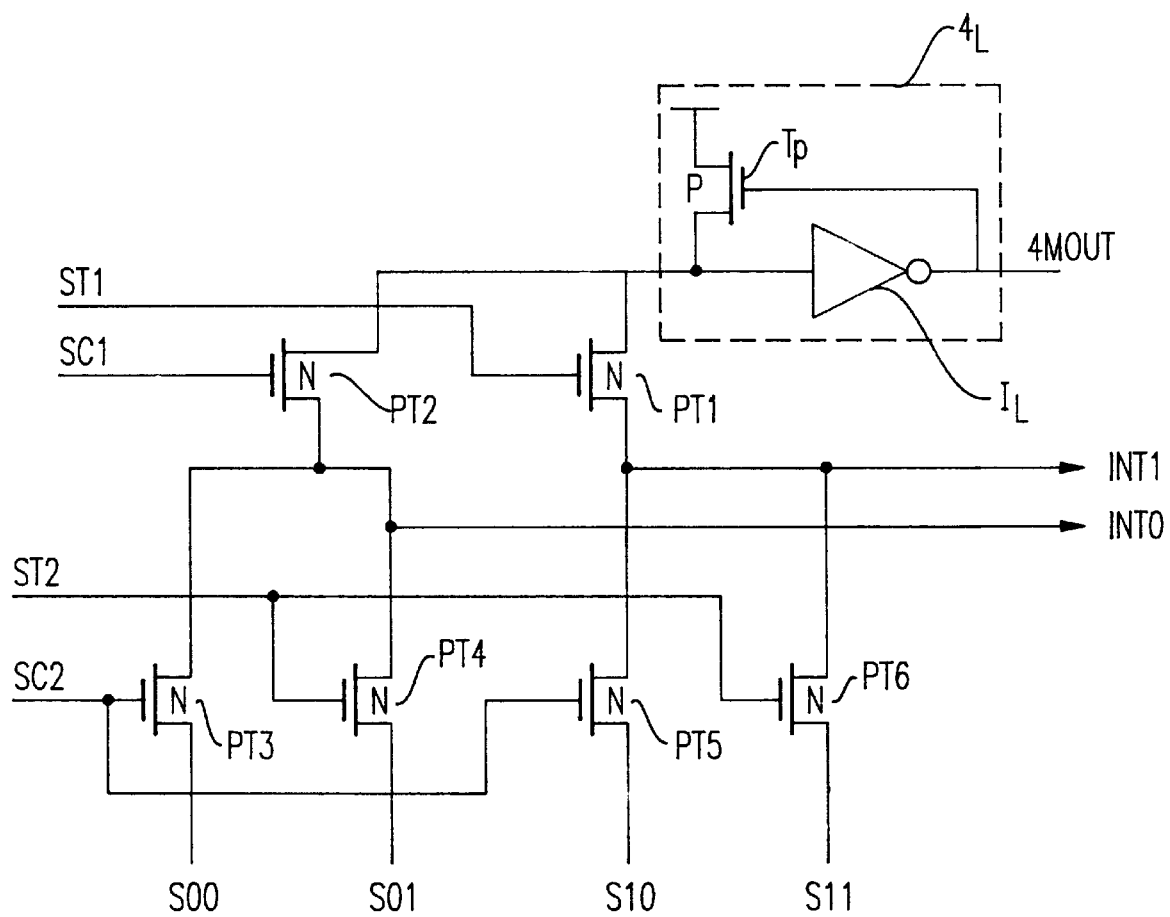
FIG. 3 shows an example transistor level schematic of a 4:1 multiplexer block of the FIG. 1 circuit diagram.

An example circuit for each of the 4:1 multiplexers 20, 22 and 24 is shown in FIG. 3. The FIG. 3 circuit comprises six pass-gate transistors PT1–PT6, where PT1 and PT2 are controlled by the signal received on the ST1 select input and its complement at the SC1 input, respectively. Transistors PT3 and PT5 are controlled by the signal received at the SC2 select input, and transistors PT4 and PT6 are controlled by the received ST2 complement of SC2. The PT3–PT6 pass transistors receive, and selectively pass, the multiplexer data from data inputs S00, S01, S10, and S11. A soft latch L outputs 4MOUT, where L is for the same timing and power reasons described for the soft latch L of the 2:1 multiplexers shown in FIG. 2.

Referring again to FIG. 1, the connection and operation of multiplexers 20, 22 and 24 will be described. Multiplexer 20 functions to select and output the one-bit SUM of the present 4-2 carry-save adder, which is defined by the overall truth Table 5, shown further below. Multiplexer 20 performs the SUM function by selecting between X and $\overline{X}$ according to the following rule:

$$\begin{aligned} SUM &= X, \text{ if } CIN = 1 \text{ and } Y = 0 \\ &\quad \text{or} \\ &\quad CIN = 0 \text{ and } Y = 1, \\ &= \overline{X}, \text{ if } CIN = 1 \text{ and } Y = 1 \\ &\quad \text{or} \\ &\quad CIN = 0 \text{ and } Y = 0. \end{aligned} \quad \text{Eq. (1)}$$

The connection by which multiplexer 20 effects Eq. (1) is shown in FIG. 1. A shown, the two respective complementary outputs Y and $\overline{Y}$ from the OUT terminals of the 2:1 multiplexers 12 and 14 connect to the complementary control inputs SC2 and ST2 of the 4:1 multiplexer 20. The carry-in signal CIN and the inverted carry-in $\overline{CIN}$ from the inverter 10 connect to the complementary inputs SC1 and ST1 of the 4:1 multiplexer 20. The complementary outputs X and $\overline{X}$ from the 2:1 multiplexers 16 and 18 connect to the four data inputs of the first 4:1 multiplexer 20, with X connected to S00 and S11 and $\overline{X}$ connected to S01 and S10.

The depicted connection and arrangement of multiplexer 20 results in two of the four possible states of the multiplexer's control inputs SC1, SC2, ST1 and SC2 selecting the X signal, and the other two of the four possible control input states to select $\overline{X}$. The 4:1 multiplexer 20 is therefore acting, in a sense, as a 2:1 multiplexer. However, as will be understood by one of ordinary skill, the 4:1 multiplexer 20, as described, performs the 2:1 selection without requiring additional logic on its control inputs, as would be required for a 2:1 multiplexer, and thereby eliminates at least one logic delay.

Referring to FIG. 3, it is seen that the depicted implementation for 4:1 multiplexers 20, 22 and 24 also outputs a pair of complementary intermediate signals, labeled as INT0 and INT1. For the present example, as shown in FIG. 1, and for reasons that will be understood, the only 4:1 multiplexer from which the outputs INT0 and INT1 are utilized is multiplexer 20. The INT0 and INT1 outputs of multiplexers 22 and 24, for the depicted embodiment, are labeled with a boxed "X", indicating that they are not connected to another circuit input.

As can be seen from FIGS. 1 and 3, the INT0 and INT1 intermediate outputs from multiplexer 20, for the connections of this example, are:

$$\begin{aligned} INT0 &= X, \text{ if } CIN = 0 \text{ and } Y = 1, \\ &= \overline{X}, \text{ if } CIN = 0 \text{ and } Y = 0, \\ INT1 &= X, \text{ if } CIN = 1 \text{ and } Y = 0, \text{ and} \\ &= \overline{X}, \text{ if } CIN = 1 \text{ and } Y = 1, \end{aligned} \quad \text{Eq. (2)}$$

The intermediate signals INT0 and INT1 are therefore, for this example, the modulo 2 result of the arithmetic sum A1+A2+A3 and represent the carry propagation for the output.

As can be seen from FIG. 3, there is no appreciable delay between the input to multiplexer 20 and its intermediate output signals INT0 and INT0 because these are taken directly from the pass gate transistors PT1–PT6, which switch very fast, prior to the soft latch L. Therefore, the output multiplexer 22, described below, is substantially coincident with the SUM signal output by multiplexer 20.

The connection of multiplexer 22, and its generation of the output C, in accordance with the Table 5 truth table, will be described. The INT0 and INT1 signals are input to the S00 and S11 inputs of the 4:1 multiplexer 22, as shown in FIG. 1.

Referring to FIG. 1, a logic one signal and a logic zero signal, shown as Vdd and as a ground symbol, connect, respectively, to the S01 and S10 data inputs of the 4:1 multiplexer 22. The A0 bit of the four one-bit data inputs, and its inverse from inverter 4, connect to the complementary control inputs SC2 and ST2 of the 4:1 multiplexer 22. The carry-in CIN and its inverse $\overline{CIN}$ from the inverter 10 connect to the complementary control inputs SC1 and ST1 of the 4:1 multiplexer 22.

By the above-described connection, the 4:1 multiplexer 22 selects and outputs C, of the present 4-2 carry-save adder, in accordance with the Table 5 truth table. The selection rule for multiplexer 22 is:

$$\begin{aligned} C &= INT0 \text{ if } CIN = 1 \text{ and } A0 = 1, \\ &= 1 \text{ if } CIN = 1 \text{ and } A0 = 1, \\ &= 0 \text{ if } CIN = 0 \text{ and } A0 = 1, \text{ and} \\ &= INT1 \text{ if } CIN = 0 \text{ and } A0 = 0. \end{aligned} \quad \text{Eq. (3)}$$

As defined in Eq. (3) above, the first carry-out bit C depends on A0, and the INT0 and INT1 signals, which depend on A1, A2 and A3, and on the carry-in bit CIN.

The third 4:1 multiplexer 24 generates the carry-out bit, designated as CARRY, in accordance with the Table 5 truth table. As can be seen from FIG. 1 and from the Table 5 truth table below, CARRY output does not depend on the carry-in CIN.

FIG. 1 shows the connections and arrangement of the 4:1 multiplexer 24 which achieve the carry-out bit CARRY, by the following selection rule:

$$\begin{aligned} CARRY &= 1 \text{ if } A1 = 1 \text{ and } A2 = 1, \\ &= \overline{A3} \text{ if } A1 = 1 \text{ and } A2 = 0, \\ &= \overline{X} \text{ if } A1 = 0 \text{ and } A2 = 1, \text{ and} \\ &= 0 \text{ if } A1 = 0 \text{ and } A2 = 0 \end{aligned} \quad \text{Eq. (4)}$$

As shown, the data input A1 which, for this example, is the second of the four one-bit data inputs, and its inverse $\overline{A1}$ from inverter 2, connect, respectively, to the complementary control inputs ST1 and SC1 of the 4:1 multiplexer 24. The data input A2 (the third of the four one-bit data inputs), and its inverse $\overline{A2}$ from inverter 8, connect, respectively, to the complementary control inputs ST2 and SC2 of the 4:1 multiplexer 24. $\overline{A3}$, which is the inverse, for this example, of the fourth of the four one-bit data inputs, connects to the S01 data input of the 4:1 multiplexer 24. The $\overline{X}$ output of the 2:1 multiplexer 18 connects to the S10 input of the 4:1 multiplexer 24. A logic one signal and a logic zero signal connect, respectively, to the S00 and S11 data inputs of the 4:1 multiplexer 24.

The output of the 4:1 multiplexer 24, when connected and formed in the described manner, is the carry-out CARRY of the 4-2 carry-save adder which, as stated above and as seen from FIG. 1, does not depend on the carry-in CIN.

The system truth table for the depicted embodiment of this invention is Table 5 below.

TABLE 5

| CIN | A0 | A1 | A2 | A3 | SUM | C | CARRY |
|---|---|---|---|---|---|---|---|
| 0 | 0 | 0 | 0 | 0 | 0 | 0 | 0 |
| 0 | 0 | 0 | 0 | 1 | 1 | 0 | 0 |
| 0 | 0 | 0 | 1 | 0 | 1 | 0 | 0 |
| 0 | 0 | 0 | 1 | 1 | 0 | 0 | 1 |
| 0 | 0 | 1 | 0 | 0 | 1 | 0 | 0 |
| 0 | 0 | 1 | 0 | 1 | 0 | 0 | 1 |
| 0 | 0 | 1 | 1 | 0 | 0 | 0 | 1 |
| 0 | 0 | 1 | 1 | 1 | 1 | 0 | 1 |
| 0 | 1 | 0 | 0 | 0 | 1 | 0 | 0 |
| 0 | 1 | 0 | 0 | 1 | 0 | 1 | 0 |
| 0 | 1 | 0 | 1 | 0 | 0 | 1 | 0 |
| 0 | 1 | 0 | 1 | 1 | 1 | 0 | 1 |
| 0 | 1 | 1 | 0 | 0 | 0 | 1 | 0 |
| 0 | 1 | 1 | 0 | 1 | 1 | 0 | 1 |
| 0 | 1 | 1 | 1 | 0 | 1 | 0 | 1 |
| 0 | 1 | 1 | 1 | 1 | 0 | 1 | 1 |
| 1 | 0 | 0 | 0 | 0 | 1 | 0 | 0 |
| 1 | 0 | 0 | 0 | 1 | 0 | 1 | 0 |
| 1 | 0 | 0 | 1 | 0 | 0 | 1 | 0 |
| 1 | 0 | 0 | 1 | 1 | 1 | 0 | 1 |
| 1 | 0 | 1 | 0 | 0 | 0 | 1 | 0 |
| 1 | 0 | 1 | 0 | 1 | 1 | 0 | 1 |
| 1 | 0 | 1 | 1 | 0 | 1 | 0 | 1 |
| 1 | 0 | 1 | 1 | 1 | 0 | 1 | 1 |
| 1 | 1 | 0 | 0 | 0 | 0 | 1 | 0 |
| 1 | 1 | 0 | 0 | 1 | 1 | 1 | 0 |
| 1 | 1 | 0 | 1 | 0 | 1 | 1 | 0 |
| 1 | 1 | 0 | 1 | 1 | 0 | 1 | 1 |
| 1 | 1 | 1 | 0 | 0 | 1 | 1 | 0 |
| 1 | 1 | 1 | 0 | 1 | 0 | 1 | 1 |
| 1 | 1 | 1 | 1 | 0 | 0 | 1 | 1 |
| 1 | 1 | 1 | 1 | 1 | 1 | 1 | 1 |

As can readily be seen by one of ordinary skill, the present invention generates the SUM bit and the C bit with three logic delays, and generates the carry-out bit CARRY with only two logic delays.

While the foregoing invention has been described with specific references to examples of its preferred embodiments, it should be understood that various substitutions, variations, and modifications may be made thereto without departing from the scope of the invention as defined in the appended claims.

Having thus described my invention, what I claim as new and desire to secure by Letters Patent is as follows:

1. A 4-2 carry-save adder comprising:
a plurality of inverters receiving a first plurality of binary signals and a second plurality of binary signals and generating a corresponding first plurality of inverted binary signals and a second plurality of inverted binary signals, respectively;
a first plurality of at least four 2:1 multiplexers, each selecting between at least two of said first plurality of binary signals and said first plurality of inverted binary signals, so as to output a plurality of at least four first intermediate signals, the selection based a value of said first plurality of binary signals and said first plurality of inverted binary signals;

a second multiplexer for selecting from, and outputting as a first output signal SUM, one from said first intermediate signals, the selection based on at least one of said first intermediate signals and at least one of said second plurality of binary signals said second plurality of inverted binary signals;
means for generating a second plurality intermediate signals based on at least three of said first intermediate signals and at least one of said second plurality of binary signals, where said second plurality are output with a propagation delay substantially less than a predetermined propagation delay of said second multiplexer;
a third multiplexer selecting between, and outputting as a carry signal, designated C, one from a logical 1, a logical 0, and said second intermediate binary signals, based on at least one of said first and second plurality of binary signals; and
a fourth 4:1 multiplexer selecting, and outputting as a carry-out signal, designated CARRY, one from said logical 1, logical 0, and two of said first plurality of inverted binary signas, based on at least two of said first plurality of binary signals.

2. A 4-2 carry-save adder comprising:
a plurality of inverters receiving first, second, third, and fourth binary signals designated A0, A1, A2, and A3, respectively, and a fifth binary signal designated CIN and generating complementary signals $\overline{A0}$, $\overline{A1}$, $\overline{A2}$, $\overline{A3}$, and $\overline{CIN}$;
first and second multiplexers, each selecting between, and outputting as a first and a second intermediate signal, designated Y and $\overline{Y}$, respectively, one from A0, A1, $\overline{A0}$ and $\overline{A1}$, according to the following truth table:

| A1 | A0 | Y | $\overline{Y}$ |
|---|---|---|---|
| 0 | 0 | A1 | $\overline{A0}$ |
| 0 | 1 | $\overline{A1}$ | $\overline{A0}$ |
| 1 | 0 | A1 | A0 |
| 1 | 1 | $\overline{A1}$ | A0 | third and fourth multiplexers selecting between, and outputting as a third and a fourth intermediate signal, designated X and $\overline{X}$, respectively, one from the A2, A3, $\overline{A2}$ and $\overline{A3}$ signals, according to the following truth table:

| A3 | A2 | X | $\overline{X}$ |
|---|---|---|---|
| 0 | 0 | A3 | $\overline{A2}$ |
| 0 | 1 | $\overline{A3}$ | $\overline{A2}$ |
| 1 | 0 | A3 | A2 |
| 1 | 1 | $\overline{A3}$ | A2 | a fifth multiplexer for selecting from, and outputting as a first output signal SUM, one from said X and $\overline{X}$, based on Y and CIN, where

| SUM | = X if | CIN = 1 and Y = 0 or |
|---|---|---|
| | | CIN = 0 and Y = 1, |
| | = $\overline{X}$ if | CIN = 1 and Y = 1 or |
| | | CIN = 0 and Y = 0; | means for receiving X, $\overline{X}$, CIN and Y, generating and outputting a fifth intermediate signal, designated INT0, and a sixth intermediate signal, designated INT1, where

| | |
|---|---|
| INT0 | = X, if CIN = 0 and Y = 1, |
| | = $\overline{X}$, if CIN = 0 and Y = 0, |
| INT1 | = X, if CIN = 1 and Y = 0, |
| | = $\overline{X}$, if CIN = 1 and Y = 1, | and where INT0 and INT1 are each output with a propagation delay substantially less than a predetermined propagation delay of said fifth multiplexer;

a sixth multiplexer selecting between, and outputting as a signal, designated C, one from a logical 1, a logical 0, said INT0 and INT1, based on said CIN and A0, where $$
\begin{aligned}
C &= INT0, \text{ if } CIN = 1 \text{ and } A0 = 1, \\
&= 1, \text{ if } CIN = 1 \text{ and } A0 = 1, \\
&= 0, \text{ if } CIN = 0 \text{ and } A0 = 1, \\
&= INT1, \text{ if } CIN = 0 \text{ and } A0 = 0,
\end{aligned}
$$

a seventh multiplexer selecting, and outputting as a carry-out signal, designated CARRY, one from said logical 1, logical 0, said $\overline{X}$ and $\overline{A3}$, based on said A1 and A2, where $$
\begin{aligned}
CARRY &= 1, \text{ if } A1 = 1 \text{ and } A2 = 1, \\
&= \overline{A3}, \text{ if } A1 = 1 \text{ and } A2 = 0, \\
&= \overline{X}, \text{ if } A1 = 0 \text{ and } A2 = 1, \\
&= 0, \text{ if } A1 = 0 \text{ and } A2 = 1.
\end{aligned}
$$

3. A 4-2 carry-save adder according to claim 2, wherein said plurality of inverters output said $\overline{A0}, \overline{A1}, \overline{A2}, \overline{A3}$, and $\overline{CIN}$ signals at a first time instant within a predetermined logic delay of receiving the A0, A1, A2, A3 and CIN signals, the first and second multiplexers output the first and second intermediate signals Y and $\overline{Y}$, and the third and fourth multiplexers output the third and fourth intermediate signals X and $\overline{X}$, at a second time instant approximately one of said predetermined logic delays after the first time instant, the fifth multiplexer outputs the first output signal SUM and the sixth multiplexer outputs the signal C at a third time instant approximately one of said predetermined logic delays after said second time instant, and the sixth multiplexer outputs the carry-out signal CARRY at a time instant approximately one of said predetermined logic delays after said first time instant.

4. A 4-2 carry save adder according to claim 2 wherein at least one of said first, second, third and fourth multiplexers comprises:

a first pass gate transistor having a gate connected to a first signal of a first set of signals, said first set of signals consisting of said A0, A1, A2, A3, $\overline{A0}, \overline{A1}, \overline{A2}$ and $\overline{A3}$, and having a first end and a second end, said second end connected to a second signal of said first set of signals;

a second pass gate transistor having a gate connected to a third signal of said first set of signals, and having a first end connected to the first end of the first pass gate transistor, and having a second end connected to a fourth signal of said first set of signals; and a soft latch having a latch input connected to the first end of the first pass gate transistor and having a latch output corresponding to the inverse of the latch input.

5. A 4-2 carry save adder according to claim 4 wherein said soft latch comprises:

an inverter having an input connected to the latch input;

an output connected to the latch output; and a transistor having a gate connected to the inverter output, a first end connected to the inverter input and a second end connected to an external voltage source.

6. A 4-2 carry save adder according to claim 2 wherein at least one of said fifth, sixth and seventh multiplexers comprises:

a first pass gate transistor having a gate connected to a first signal of a second set of signals, said second set consisting of said Y, $\overline{Y}$, CIN, $\overline{CIN}$, A0, A1, A2, A3, $\overline{A0}, \overline{A1}, \overline{A2}$ and $\overline{A3}$, and having a first end and a second end;

a second pass gate transistor having a gate connected to a second signal of said second set of signals, and having a first end connected to the first end of the first pass gate transistor, and having a second end;

a third pass gate transistor having a gate connected to a third signal of said second set of signals, and having a first end connected to the second end of the first pass gate transistor, and having a second end connected to a first signal of a third set of signals, said third set of signals consisting of said X, $\overline{X}$, INT0, INT1, logical one, logical zero, and $\overline{A3}$;

a fourth pass gate transistor having a gate connected to a fourth signal of said second set of signals, and having a first end connected to the first end of the third pass gate transistor, and having a second end connected to a second signal of said third set of signals;

a fifth pass gate transistor having a gate connected to the gate of the third pass gate transistor, and having a first end connected to the second end of the second pass gate transistor, and having a second end connected to a third signal of said third set of signals;

a sixth pass gate transistor having a gate connected to the gate of the fourth pass gate transistor, and having a first end connected to the first end of the fifth pass gate transistor, and having a second end connected to a fourth signal of said third set of signals; and a soft latch having a latch input connected to the first end of the first pass gate transistor and the first end of the second pass gate transistor and having a latch output corresponding to the inverse of the latch input.

7. A 4-2 carry save adder according to claim 6 wherein said soft latch comprises:

an inverter having an input connected to the latch input;

an output connected to the latch output;

a pass gate transistor having a gate connected to the inverter output, a first end connected to the inverter input and a second end connected to an external voltage source.

* * * * *